US007612768B2

(12) United States Patent
Muraki

(10) Patent No.: US 7,612,768 B2
(45) Date of Patent: Nov. 3, 2009

(54) DISPLAY DRIVER AND ELECTRONIC INSTRUMENT INCLUDING DISPLAY DRIVER

(75) Inventor: Norichika Muraki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 672 days.

(21) Appl. No.: 11/016,731

(22) Filed: Dec. 21, 2004

(65) Prior Publication Data

US 2005/0156919 A1 Jul. 21, 2005

(30) Foreign Application Priority Data

Jan. 5, 2004 (JP) ............................ 2004-000388

(51) Int. Cl.
*G06F 3/038* (2006.01)
*G11C 16/06* (2006.01)

(52) U.S. Cl. .................... 345/204; 365/18.2; 365/18.21

(58) Field of Classification Search ......... 345/204-207, 345/690-699; 365/185.2-185.21
See application file for complete search history.

(56) References Cited

U.S. PATENT DOCUMENTS

| | | | | |
|---|---|---|---|---|
| 4,571,585 | A * | 2/1986 | Stein et al. | 345/96 |
| 5,347,294 | A | 9/1994 | Usui et al. | |
| 5,465,102 | A | 11/1995 | Usui et al. | |
| 5,581,501 | A * | 12/1996 | Sansbury et al. | 365/185.01 |
| 5,844,533 | A | 12/1998 | Usui et al. | |
| 7,002,563 | B2 | 2/2006 | Nakamura | |
| 7,038,646 | B2 | 5/2006 | Fallot-Burghardt et al. | |
| 7,098,902 | B2 | 8/2006 | Tamura | |
| 2003/0132906 | A1 | 7/2003 | Tanaka et al. | |
| 2003/0169245 | A1 | 9/2003 | Tamura | |
| 2004/0150647 | A1 * | 8/2004 | Aleksic et al. | 345/555 |

FOREIGN PATENT DOCUMENTS

| | | |
|---|---|---|
| JP | A-1-213624 | 8/1989 |
| JP | A-5-88647 | 4/1993 |
| JP | A-5-199482 | 8/1993 |
| JP | A-2002-311926 | 10/2002 |
| JP | A-2003-263133 | 9/2003 |
| JP | A-2003-263138 | 9/2003 |
| JP | A-2003-280615 | 10/2003 |

* cited by examiner

*Primary Examiner*—Alexander Eisen
*Assistant Examiner*—Cory A Almeida
(74) *Attorney, Agent, or Firm*—Oliff & Berridge, PLC

(57) ABSTRACT

A display driver including: a scan driver and a data driver which drive a display panel; a one-time PROM (OTP) circuit which includes a plurality of OTP cells; a control circuit; and a control register. A display characteristic parameter corresponding to display characteristics of the display panel is written into the OTP circuit during initialization. The control register stores the display characteristic parameter supplied from the OTP circuit. Each of the OTP cells includes a floating-gate transistor which has a floating gate. The control circuit performs refresh operation at a predetermined timing set in first half of a non-display period of the display panel, the refresh operation including reading the display characteristic parameter from the OTP circuit and rewriting the display characteristic parameter into the control register.

13 Claims, 13 Drawing Sheets

DISPLAY DRIVER AND ELECTRONIC INSTRUMENT INCLUDING DISPLAY DRIVER

Japanese Patent Application No. 2004-388, filed on Jan. 5, 2004, is hereby incorporated by reference in its entirety.

BACKGROUND OF THE INVENTION

The present invention relates to a display driver and an electronic instrument including the display driver.

As the resolution of a display panel is increased, display characteristics of the display panel must be taken into consideration in order to increase the image quality of the display panel. Since the display panel has uneven display characteristics, a display driver which can flexibly deal with various display panels is necessary. Moreover, since an increase in the resolution of the display panel causes the display panel to be easily affected by external static electricity or the like, data stored in a register provided in an electronic instrument including the display panel may be adversely affected.

Japanese Patent Application Laid-open No. 2003-263134 discloses a display driver which solves the above-mentioned problem. However, since a large amount of electric power is consumed by a register refresh operation or the like, the display state of the display panel may be adversely affected.

BRIEF SUMMARY OF THE INVENTION

According to a first aspect of the present invention, there is provided a display driver, comprising:

a scan driver and a data driver which drive a display panel;

a one-time PROM (OTP) circuit which includes a plurality of OTP cells;

a control circuit; and a control register, wherein a display characteristic parameter corresponding to display characteristics of the display panel is written into the OTP circuit during initialization;

wherein the control register stores the display characteristic parameter supplied from the OTP circuit;

wherein each of the OTP cells includes a floating-gate transistor which has a floating gate;

wherein the control circuit outputs a read signal to the OTP circuit when reading the display characteristic parameter from the OTP circuit;

wherein the control circuit outputs a write signal to the OTP circuit when writing the display characteristic parameter into the OTP circuit; and wherein the control circuit performs refresh operation at a predetermined timing set in first half of a non-display period of the display panel, the refresh operation including reading the display characteristic parameter from the OTP circuit and rewriting the display characteristic parameter into the control register.

According to a second aspect of the present invention, there is provided a display driver, comprising:

a scan driver and a data driver which drive a display panel;

a nonvolatile storage circuit;

a control circuit; and a control register, wherein a display characteristic parameter corresponding to display characteristics of the display panel is written into the nonvolatile storage circuit during initialization;

wherein the control register stores the display characteristic parameter supplied from the nonvolatile storage circuit; and wherein the control circuit performs a refresh operation which includes reading the display characteristic parameter from the nonvolatile storage circuit and rewriting the display characteristic parameter into the control register at a predetermined timing set in first half of a non-display period of the display panel.

According to a third aspect of the present invention, there is provided a display driver, comprising:

a scan driver and a data driver which drive a display panel;

a nonvolatile storage circuit;

a control circuit; and a control register, wherein a display characteristic parameter corresponding to display characteristics of the display panel is written into the nonvolatile storage circuit during initialization;

wherein the control register stores the display characteristic parameter supplied from the nonvolatile storage circuit;

wherein the control circuit performs a refresh operation which includes reading the display characteristic parameter from the nonvolatile storage circuit and rewriting the display characteristic parameter into the control register at a predetermined timing set in a non-display period of the display panel; and wherein the control circuit disables the refresh operation of the nonvolatile storage circuit in a period in which a processor unit which controls the display driver accesses the control circuit.

According to a fourth aspect of the present invention, there is provided a display driver, comprising:

a scan driver and a data driver which drive a display panel;

a nonvolatile storage circuit;

a control circuit; and a control register, wherein a display characteristic parameter corresponding to display characteristics of the display panel is written into the nonvolatile storage circuit during initialization;

wherein the control register stores the display characteristic parameter supplied from the nonvolatile storage circuit;

wherein the control circuit performs a refresh operation which includes reading the display characteristic parameter from the nonvolatile storage circuit and rewriting the display characteristic parameter into the control register at a predetermined timing set in a non-display period of the display panel; and wherein the control circuit controls the scan driver and the data driver so that a voltage used by the scan driver for driving the display panel is equal to a voltage used by the data driver for driving the display panel, in the non-display period.

According to a fifth aspect of the present invention, there is provided an electronic instrument, comprising:

any of the above-described display drivers;

a display panel; and a processor unit which controls the display driver.

DETAILED DESCRIPTION OF THE EMBODIMENTS

Figure 1:
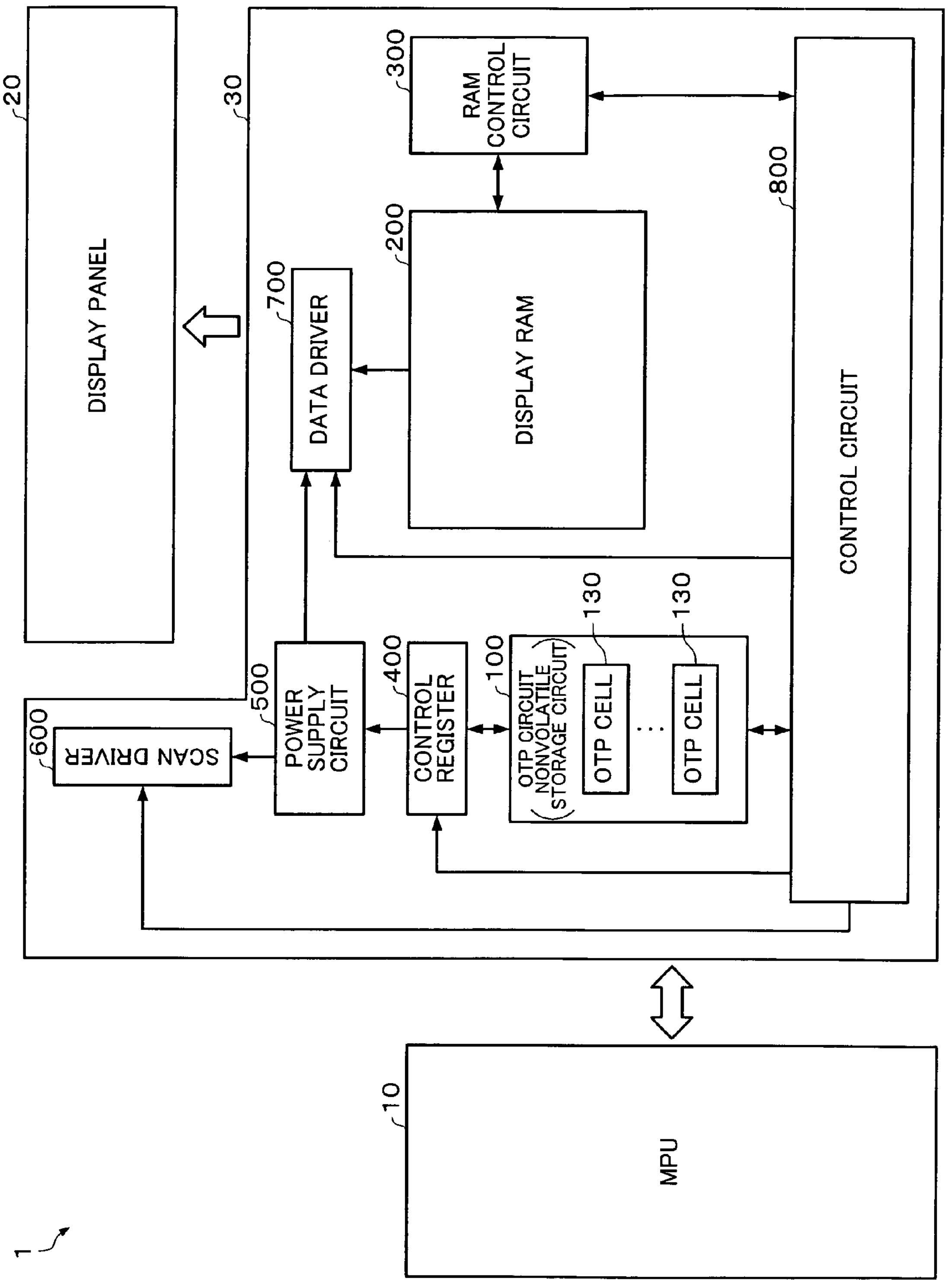
FIG. 1 is a block diagram showing an electro-optical device.

The present invention has been achieved in view of the above-mentioned technical problems, and following embodiments of the present invention may provide a display driver which can flexibly deal with display characteristics of a display panel while reducing effects on the display state of the display panel.

According to one embodiment of the present invention, there is provided a display driver, comprising:

a scan driver and a data driver which drive a display panel;

a one-time PROM (OTP) circuit which includes a plurality of OTP cells;

a control circuit; and a control register, wherein a display characteristic parameter corresponding to display characteristics of the display panel is written into the OTP circuit during initialization;

wherein the control register stores the display characteristic parameter supplied from the OTP circuit;

wherein each of the OTP cells includes a floating-gate transistor which has a floating gate;

wherein the control circuit outputs a read signal to the OTP circuit when reading the display characteristic parameter from the OTP circuit;

wherein the control circuit outputs a write signal to the OTP circuit when writing the display characteristic parameter into the OTP circuit; and wherein the control circuit performs refresh operation at a predetermined timing set in first half of a non-display period of the display panel, the refresh operation including reading the display characteristic parameter from the OTP circuit and rewriting the display characteristic parameter into the control register.

According to this embodiment, effects on a display state of the display panel can be reduced even if a change in the power supply voltage or the like occurs due to the refresh operation. Since the OTP circuit includes the floating-gate transistor in this embodiment, the OTP circuit is easily provided in the display driver. Moreover, since an arbitrary display characteristic parameter can be stored in the display driver, the display driver can flexibly deal with various display panels.

In this display driver, each of the OTP cells may include a decision transistor provided between a node of a first power supply and a node of a second power supply; and a reference voltage may be input to a gate of the decision transistor.

This enables each OTP cell to accurately output the written data.

In this display driver, each of the OTP cells may include: a first output transistor provided in series with the decision transistor between the node of the first power supply and the node of the second power supply; and a second output transistor provided between the node of the second power supply and a first node which is connected to a gate of the first output transistor; and a drain and a gate of the second output transistor may be connected to the first node.

This enables each OTP cell to output the data stored in the OTP cell.

In this display driver, each of the OTP cells may include a read transistor provided between the first node and a second node which is connected to a drain of the floating-gate transistor; and the read signal may be input to a gate of the read transistor.

This enables data stored in each OTP cell to be read.

In this display driver, each of the OTP cells may include a write transistor provided between the second node and the node of the second power supply; and the write signal may be input to a gate of the write transistor.

This enables to write data into an arbitrary OTP cell.

In this display driver, each of the OTP cells may include a protection transistor provided between the node of the first power supply and the second node and in parallel with the floating-gate transistor; and the control circuit may output a protection signal which protects the floating-gate transistor against deterioration to a gate of the protection transistor when data reading from the OTP circuit or data writing into the OTP circuit is not performed.

This enables the floating-gate transistor to be protected against a disturbance voltage.

In this display driver, the OTP circuit may include a reference cell which includes the floating-gate transistor; and the reference cell may generate the reference voltage and supply the reference voltage to the decision transistor.

This allows the reference cell to exhibit deterioration characteristics corresponding to the deterioration characteristics of the OTP circuit.

In this display driver, the reference cell may include a third output transistor provided between the node of the first power supply and the node of the second power supply;

the floating-gate transistor may be provided between the node of the first power supply and a node which is connected to a gate of the third output transistor; and current capability of the third output transistor may be lower than current capability of the first output transistor.

This enables the reference voltage optimum for the OTP circuit to be output.

In this display driver, the control circuit may control the scan driver and the data driver so that a voltage used by the scan driver for driving the display panel is equal to a voltage used by the data driver for driving the display panel, in the non-display period.

This enables to reduce effects on the display panel during the refresh operation.

In this display driver, the control circuit may disable the refresh operation of the OTP circuit in a period in which a processor unit which controls the display driver accesses the control circuit.

This prevents malfunctions caused by a change in the power supply voltage or the like.

The display driver may further comprise a power supply circuit, the display characteristic parameter may include a contrast adjustment parameter; and the power supply circuit may receive from the control register the contrast adjustment parameter written into the control register from the OTP circuit, and output a predetermined voltage based on the contrast adjustment parameter.

This enables the power supply circuit to output the drive voltage optimum for the display panel.

According to one embodiment of the present invention, there is provided a display driver, comprising:

a scan driver and a data driver which drive a display panel;

a nonvolatile storage circuit;

a control circuit; and a control register, wherein a display characteristic parameter corresponding to display characteristics of the display panel is written into the nonvolatile storage circuit during initialization;

wherein the control register stores the display characteristic parameter supplied from the nonvolatile storage circuit; and wherein the control circuit performs refresh operation at a predetermined timing set in first half of a non-display period of the display panel, the refresh operation including reading the display characteristic parameter from the nonvolatile storage circuit and rewriting the display characteristic parameter into the control register.

According to one embodiment of the present invention, there is provided a display driver, comprising:

a scan driver and a data driver which drive a display panel;

a nonvolatile storage circuit;

a control circuit; and a control register, wherein a display characteristic parameter corresponding to display characteristics of the display panel is written into the nonvolatile storage circuit during initialization;

wherein the control register stores the display characteristic parameter supplied from the nonvolatile storage circuit;

wherein the control circuit performs refresh operation at a predetermined timing set in a non-display period of the display panel, the refresh operation including reading the display characteristic parameter from the nonvolatile storage circuit and rewriting the display characteristic parameter into the control register; and wherein the control circuit disables the refresh operation of the nonvolatile storage circuit in a period in which a processor unit which controls the display driver accesses the control circuit.

According to one embodiment of the present invention, there is provided a display driver, comprising:

a scan driver and a data driver which drive a display panel;

a nonvolatile storage circuit;

a control circuit; and a control register, wherein a display characteristic parameter corresponding to display characteristics of the display panel is written into the nonvolatile storage circuit during initialization;

wherein the control register stores the display characteristic parameter supplied from the nonvolatile storage circuit;

wherein the control circuit performs refresh operation at a predetermined timing set in a non-display period of the display panel, the refresh operation including reading the display characteristic parameter from the nonvolatile storage circuit and rewriting the display characteristic parameter into the control register; and wherein the control circuit controls the scan driver and the data driver so that a voltage used by the scan driver for driving the display panel is equal to a voltage used by the data driver for driving the display panel, in the non-display period.

According to one embodiment of the present invention, there is provided an electronic instrument, comprising:

any of the above-described display drivers;

a display panel; and a processor unit which controls the display driver.

These embodiments will be described below with reference to the drawings. Note that the embodiments described below do not in any way limit the scope of the invention laid out in the claims herein. In addition, not all of the elements of the embodiments described below should be taken as essential requirements of the present invention.

1. Electro-optical Device

FIG. 1 is a block diagram showing an electro-optical device 1. The electro-optical device 1 includes an MPU (processor unit which controls a display driver in a broad sense) 10, a display panel (liquid crystal panel in a narrow sense) 20, and a display driver 30.

The display driver 30 includes an OTP circuit (nonvolatile storage circuit in a broad sense) 100, a display RAM 200, a RAM control circuit 300, a control register 400, a power supply circuit 500, a scan driver 600, a data driver 700, and a control circuit 800. The OTP circuit 100 includes a plurality of OTP cells 130. The control circuit 800 controls the OTP circuit 100, the RAM control circuit 300, the control register 400, the power supply circuit 500, the scan driver 600, and the data driver 700 according to a control signal from the MPU 10.

The OTP circuit 100 stores a contrast adjustment parameter (display characteristic parameter in a broad sense) according to the control signal from the control circuit 800, for example. The control register 400 stores the contrast adjustment parameter according to the output from the OTP circuit 100 and the control signal from the control circuit 800. The power supply circuit 500 generates a predetermined voltage according to the contrast adjustment parameter supplied from the control register 400, and supplies the predetermined voltage to the scan driver 600 and the data driver 700. The RAM control circuit 300 controls the display RAM 200 according to the control signal from the control circuit 800. The display RAM 200 stores display data for one frame according to the control signal from the RAM control circuit 300, and outputs the display data to the data driver 700, for example. In the remaining drawings, sections indicated by the same symbols have the same meanings.

2. OTP Circuit

Figure 2:
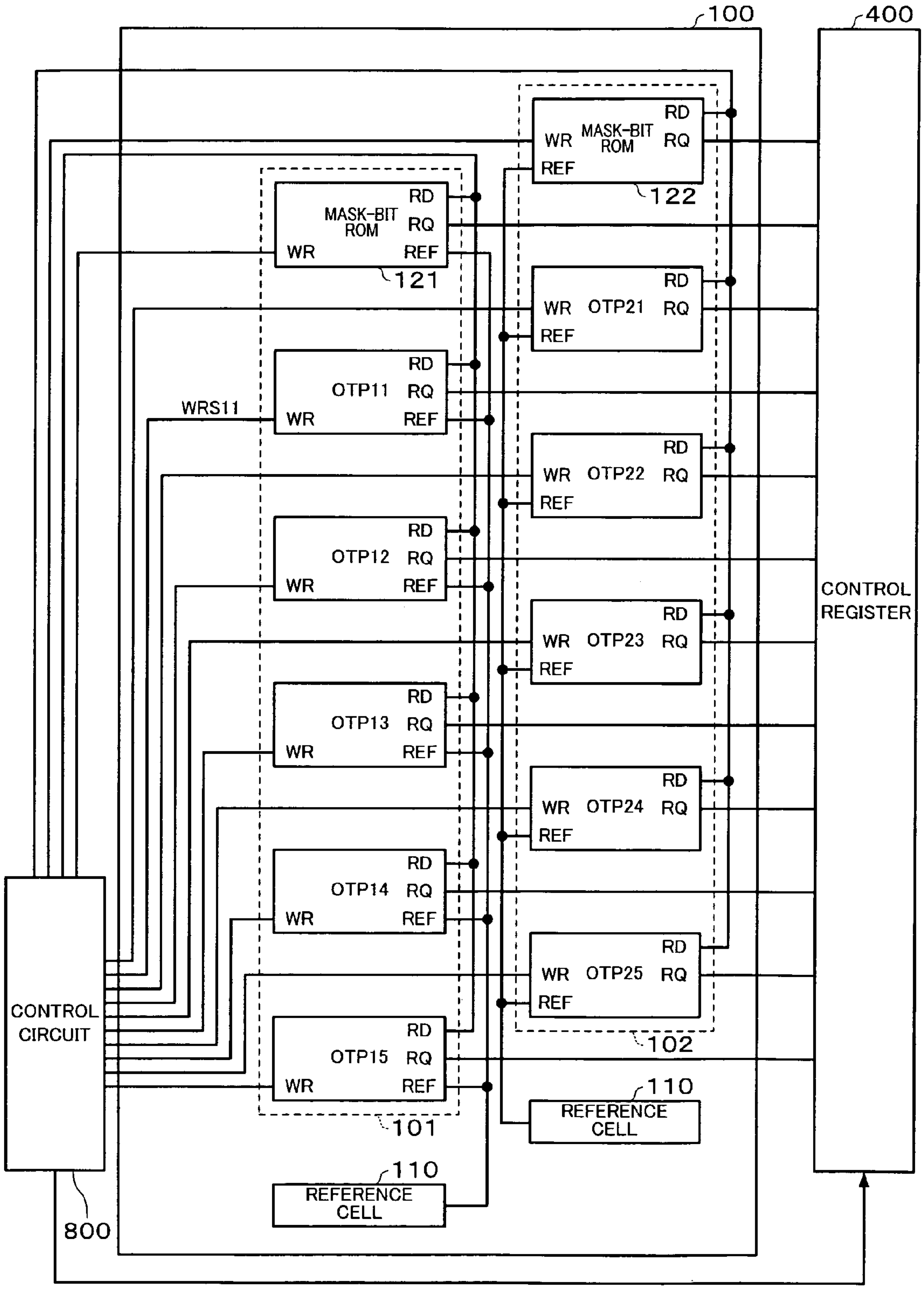
FIG. 2 is a diagram showing the connection relationship among an OTP circuit, a control register, and a control circuit.

FIG. 2 is a diagram showing the connection relationship among the OTP circuit 100, the control register 400, and the control circuit 800. The OTP circuit 100 includes ten OTP cells 130, specifically, OTP cells OTP11 to OTP15 and OTP21 to OTP25, for example. Reference cells 110 output a reference voltage to inputs REF of the OTP cells OTP11 to OTP15 and OTP21 to OTP25. Each of the OTP cells OTP11 to OTP15 and OTP21 to OTP25 stores one bit of information, for example. Outputs RQ of the OTP cells OTP11 to OTP15 and OTP21 to OTP25 are connected with the control register 400. In this embodiment, the OTP cells OTP11 to OTP15 make up a first OTP cell group 101, the OTP cells OTP21 to OTP25 make up a second OTP cell group 102, and each of the first OTP cell group 101 and the second OTP cell group 102 can store 5-bit data, for example. However, the present invention is not limited thereto. The OTP cell 130 may be configured to store two bits of information, for example.

During initialization, the contrast adjustment parameter is written into at least one of the first OTP cell group 101 and the second OTP cell group 102 according to the control performed by the control circuit 800. For example, when writing data into the OTP cell OTP11, the control circuit 800 outputs a high-level write signal WRS11 to an input WR of the OTP cell OTP11. The control circuit 800 writes bit information for selecting the output from either the first OTP cell group 101 or the second OTP cell group 102 into a mask-bit ROM 121 or a mask-bit ROM 122. For example, when outputting data stored in the second OTP cell group 102 to the control register 400, bit information which causes the output from the mask-bit ROM 122 to be set at the low level may be written into the mask-bit ROM 122 during initialization. In this embodiment, each of the mask-bit ROMs 121 and 122 is formed by a floating-gate transistor (nonvolatile memory element in a broad sense) including a floating gate.

The control circuit 800 has two read modes (read mode 1 and read mode 2).

In the read mode 1, the control circuit 800 outputs a read signal XREAD to either the first OTP cell group 101 or the second OTP cell group 102 corresponding to the bit information written into each of the mask-bit ROMs 121 and 122. This causes the contrast adjustment parameter stored in either the first OTP cell group 101 or the second OTP cell group 102 to be output to the control register 400.

For example, when the bit information has been written into only the mask-bit ROM 121, specifically, when the output from the mask-bit ROM 121 is set at the low level and the output from the mask-bit ROM 122 is set at the high level, the contrast adjustment parameter stored in the first OTP cell group 101 is used for contrast adjustment. When the bit information has been written into only the mask-bit ROM 122, specifically, when the output from the mask-bit ROM 121 is set at the high level and the output from the mask-bit ROM 122 is set at the low level, the contrast adjustment parameter stored in the second OTP cell group 102 is used for contrast adjustment. When the outputs from both the mask-bit ROMs 121 and 122 are set at the low level, the contrast adjustment parameter stored in the second OTP cell group 102 is used for contrast adjustment.

Since the bit information written into the mask-bit ROMs 121 and 122 is stored in the control register 400, the control circuit 800 can refer to the bit information written into the mask-bit ROMs 121 and 122 by referring to the output from the control register 400. As a modification, the outputs RQ of the mask-bit ROMs 121 and 122 may be connected with the control circuit 800. The first letter X of the symbol of each signal means a negative logic.

In the read mode 2, the control circuit 800 may output the read signal XREAD arbitrarily to one of the first OTP cell group 101 and the second OTP cell group 102 independent of the information stored in the mask-bit ROMs 121 and 122.

When reading the contrast adjustment parameter from the OTP circuit 100, the control circuit 800 outputs the read signal XREAD to the OTP circuit 100. For example, the read signal XREAD is input to an input RD of the OTP cell OTP21 of the OTP circuit 100. In the read mode 1, the first OTP cell group 101 is selected when the bit information has been written into only the mask-bit ROM 121, and the second OTP cell group 102 is selected when the bit information has been written into only the mask-bit ROM 122 or the bit information has been written into both the mask-bit ROMs 121 and 122. In the read mode 2, an arbitrary OTP cell group is selected by the control circuit 800. The contrast adjustment parameter stored in the selected OTP cell group is used for contrast adjustment.

As described above, in this embodiment, the OTP cell groups 101 and 102 can be selectively used by the control performed by the control circuit 800. The floating-gate transistor PROM in this embodiment is a one-time-PROM (OT-PROM) which cannot be erased. However, since a plurality of OTP cell groups are provided in the OTP circuit 100, it is possible to deal with erroneous writing during initialization.

In this embodiment, the 5-bit contrast adjustment parameter is stored in the OTP circuit 100 as an example. However, another display characteristic parameter may be stored. For example, the display characteristic parameter (grayscale information, oscillation frequency, PWM setting information, or the like) may be stored in the OTP circuit 100 in addition to the contrast adjustment parameter by changing the number of OTP cells 130. As the grayscale information, a frame rate used for a frame rate control (FRC) drive method or the like can be given. As the PWM setting information, setting information on the pulse rise timing of a grayscale clock pulse or the like can be given.

Specific information on the electro-optical device 1 or the display driver 30 (product number, ID number, lot number, or the like) may be stored in the OTP circuit 100. The reference cell 110 may be provided in each of the OTP cells 130.

Figure 3:
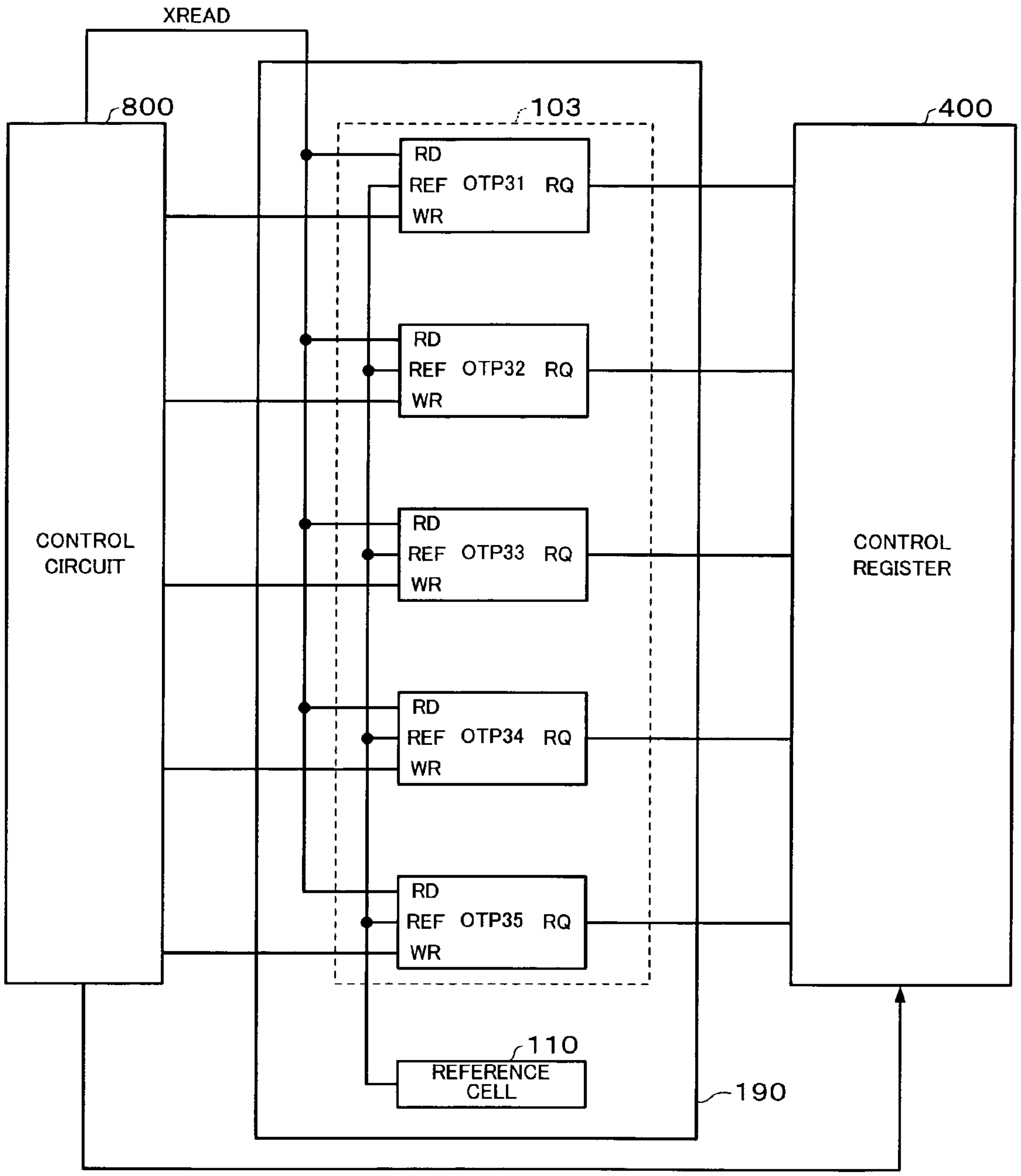
FIG. 3 is a diagram showing an OTP circuit formed of a group of OTP cells, a control circuit, and a control register.

FIG. 3 is a diagram showing an OTP circuit 190 formed of a group of OTP cells, the control circuit 800, and the control register 400. An OTP cell group 103 shown in FIG. 3 is formed by five OTP cells 130 as an example. However, the present invention is not limited thereto in the same manner as in the description given with reference to FIG. 2. The reference cell 110 outputs the reference voltage to inputs REF of OTP cells OTP31 to OTP35.

During initialization, the control circuit 800 writes the contrast adjustment parameter into the OTP circuit 190. When reading the contrast adjustment parameter, the control circuit 800 outputs the read signal XREAD to inputs RD of the OTP cells OTP31 to OTP35. This causes the OTP circuit 190 to output the contrast adjustment parameter to the control register 400.

In this embodiment, the OTP circuit 100 shown in FIG. 2 may be replaced by the OTP circuit 190 shown in FIG. 3.

Figure 4:
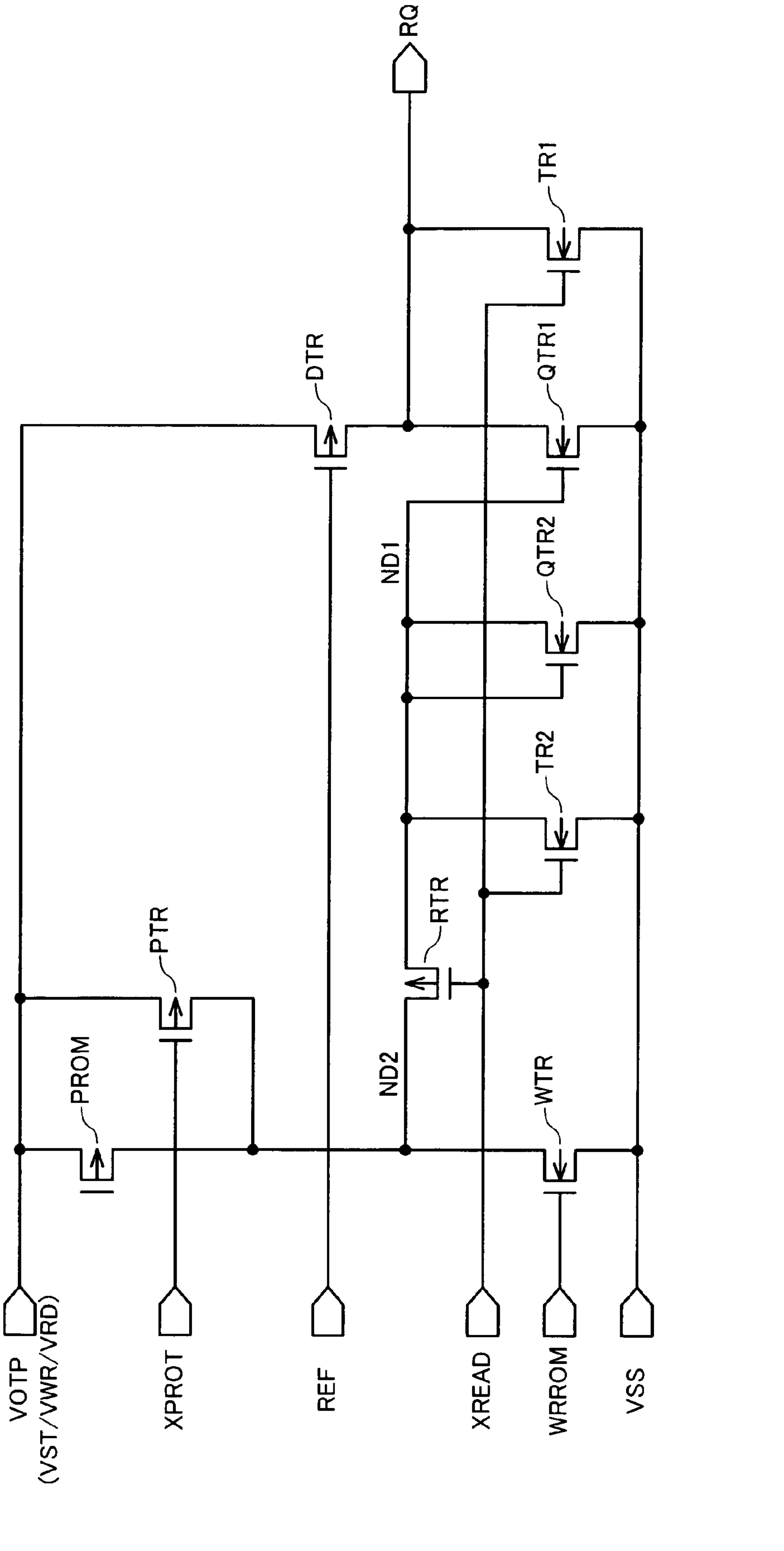
FIG. 4 is a circuit diagram showing an OTP cell.
Figure 5:
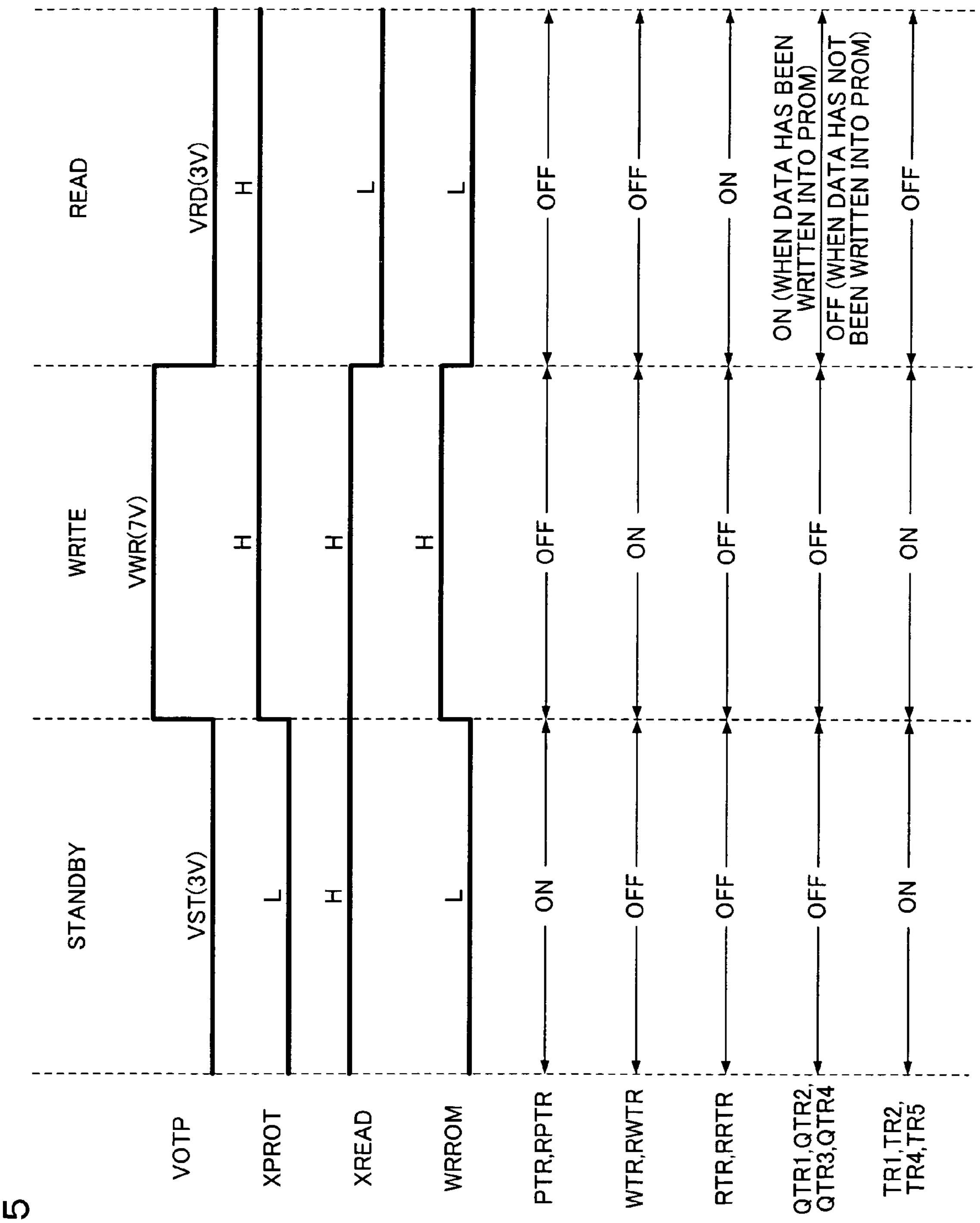
FIG. 5 shows signal levels of a protection signal, a read signal, and a write signal in each operation for an OTP cell.

FIG. 4 is a circuit diagram showing the OTP cell 130. FIG. 5 is a diagram showing a value of a voltage VOTP and signal levels of a protection signal XPROT, read signal XREAD, and write signal WRROM in each operation (write, read, and standby) performed for the OTP cell 130.

When the OTP cell 130 shown in FIG. 4 is not subjected to the read operation or the write operation, specifically, during standby, the control circuit 800 outputs the active (low level) protection signal XPROT as shown in FIG. 5 to a gate electrode of a protection transistor PTR. Specifically, the protection transistor PTR is turned ON as shown in FIG. 5. This causes a source and a drain of the floating-gate transistor PROM to be set at the same potential, whereby deterioration of the floating-gate transistor PROM can be prevented. In FIG. 5, the voltage VOTP is set at a standby voltage VST (3 V, for example) during standby. The standby voltage VST may be set at a voltage VSS. A symbol REF shown in FIG. 4 indicates the output from the reference cell 110.

When subjecting the OTP cell 130 shown in FIG. 4 to the write operation during initialization, the control circuit 800 sets the voltage VOTP at a write voltage VWR (7 V, for example). The control circuit 800 outputs the active (high level) write signal WRROM as shown in FIG. 5 to a gate of a write transistor WTR. This causes the write transistor WTR to be turned ON as shown in FIG. 5. The voltage VSS is 0 V, for example. Specifically, the voltage VWR is applied to the source of the floating-gate transistor PROM, and the voltage VSS is applied to the drain of the floating-gate transistor PROM. When such a high voltage (write voltage VWR) is applied to the floating-gate transistor PROM, the PN junction in the floating-gate transistor PROM breaks down, whereby electrons are released. Since the released electrons are trapped in the gate electrode of the floating-gate transistor PROM, a channel is formed in the channel region of the floating-gate transistor PROM. Specifically, when the floating-gate transistor PROM has been subjected to the write operation, electricity is conducted between the source and the drain of the floating-gate transistor PROM.

In the write operation, the signal level of the protection signal XPROT is set at the high level (inactive) as shown in FIG. 5, whereby the protection transistor PTR is turned OFF. As shown in FIG. 5, the signal level of the read signal XREAD input to a gate of a read transistor RTR is set at the high level (inactive). This causes the read transistor RTR to be turned OFF and transistors TR1 and TR2 to be turned ON. Since the voltage VSS is applied to a source of the transistor TR1, the voltage of the signal from the output RQ of the OTP cell 130 shown in FIG. 4 is set at the voltage VSS. Specifically, in the write operation, the voltage of the signal from the output RQ of the OTP cell 130 is set at the voltage VSS. Since the voltage VSS is applied to gate electrodes of first and second output transistors QTR1 and QTR2 by causing the transistor TR2 to be turned ON as shown in FIG. 5, the first and second output transistors QTR1 and QTR2 are reliably turned OFF.

When subjecting the OTP cell 130 shown in FIG. 4 to the read operation, the control circuit 800 outputs the active (low level) read signal XREAD as shown in FIG. 5 to the gate of the read transistor RTR and outputs the inactive (low level) write signal WRROM to the gate of the write transistor WTR. This causes the read transistor RTR to be turned ON and the transistors TR1 and TR2 and the write transistor WTR to be turned OFF. The control circuit 800 outputs the inactive (high level) protection signal XPROT to the gate of the protection transistor PTR. This causes the protection transistor PTR to be turned OFF.

The control circuit 800 sets the voltage VOTP at a read voltage VRD (3 V, for example) as shown in FIG. 5. The output (reference voltage in a broad sense) from the reference cell 110 is supplied to a gate of a decision transistor DTR. When the floating-gate transistor PROM shown in FIG. 4 has been subjected to the write operation, electricity is conducted between the source and the drain of the floating-gate transistor PROM, whereby current flows through first and second nodes ND1 and ND2 shown in FIG. 4. Specifically, the first and second output transistors QTR1 and QTR2 are turned ON. Since the first and second output transistors QTR1 and QTR2 are designed to be the same size, the current supply capabilities of the transistors QTR1 and the QTR2 are the same. Specifically, since the gates of the transistors QTR1 and QTR2 are connected with the node ND1, the on-state resistance of the transistor QTR1 is as small as the on-state resistance of the transistor QTR2. Since the output from the reference cell 110 is supplied to the gate of the decision transistor DTR, the decision transistor DTR is turned ON. However, since the output voltage of the reference cell 110 is set at a comparatively high voltage, the current supply capability of the decision transistor DTR is lower than the current supply capability of the transistor QTR1. Specifically, since the on-state resistance of the transistor QTR1 becomes lower than the on-state resistance of the transistor DTR, the voltage of the signal from the output RQ of the OTP cell 130 shown in FIG. 4 is set at a low-level voltage (voltage a little higher than the voltage VSS).

However, since electricity is not conducted between the source and the drain of the floating-gate transistor PROM when the floating-gate transistor PROM shown in FIG. 4 is a floating-gate transistor PROM which is not subjected to the write operation, current does not flow through the first and second nodes ND1 and ND2. This causes the first and second output transistors QTR1 and QTR2 to be turned OFF as shown in FIG. 5. This allows the on-state resistance of the transistor QTR1 to be sufficiently higher than the on-state resistance of the transistor DTR, whereby the voltage of the signal from the output RQ of the OTP cell 130 shown in FIG. 4 is set at a high-level voltage (voltage a little lower than the read voltage VRD).

Figure 6:
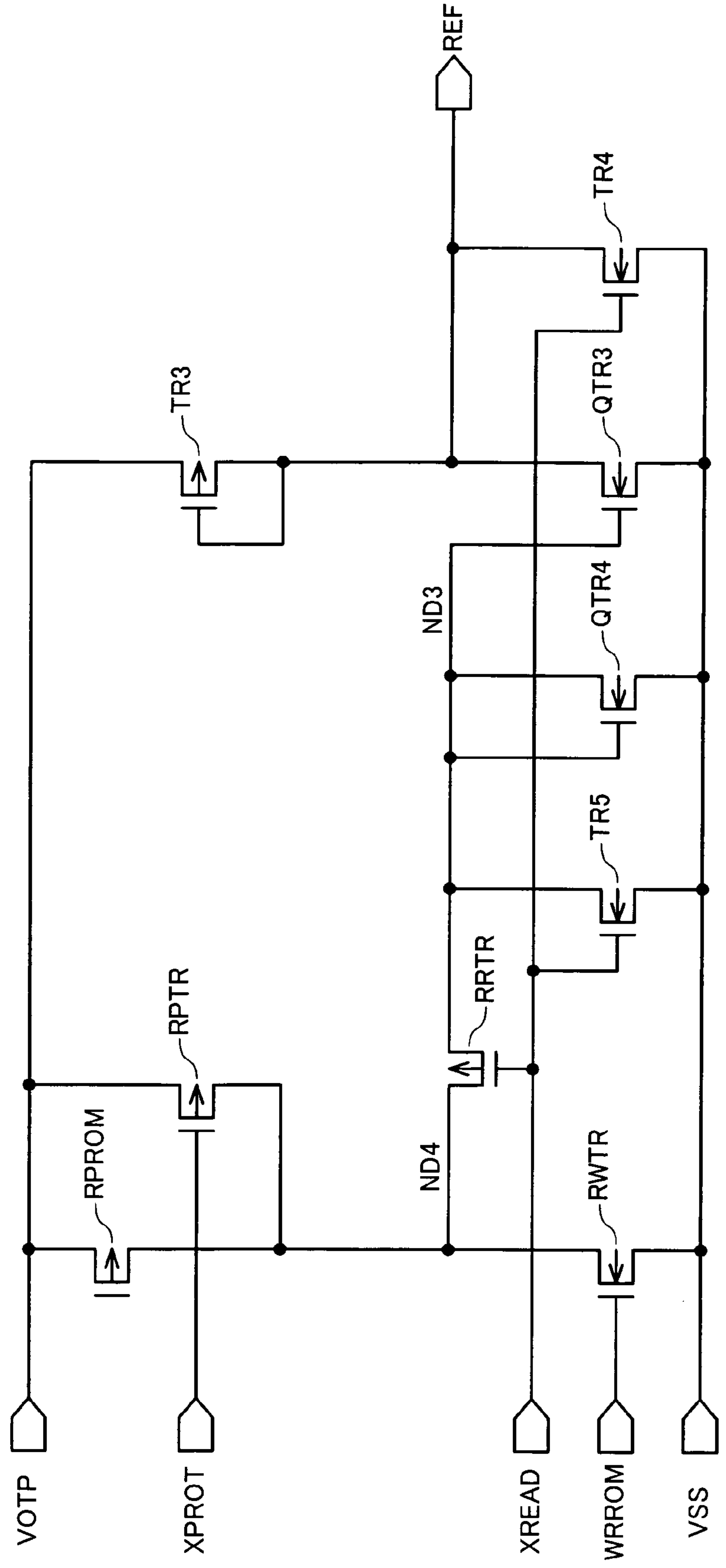
FIG. 6 is a circuit diagram showing a reference cell.

FIG. 6 is a circuit diagram showing the reference cell 110. A floating-gate transistor RPROM is subjected to the write operation during product inspection, for example. This allows electricity to be conducted between a source and a drain of the floating-gate transistor RPROM. The floating-gate transistor RPROM has the same size and the same structure as the floating-gate transistor PROM shown in FIG. 4. However, the present invention is not limited thereto. A third output transistor QTR3 is configured to have a size smaller than the size of the first output transistor QTR1 shown in FIG. 4. The third output transistor QTR3 is configured to have a size ⅛ of the size of the first output transistor QTR1, for example. A fourth output transistor QTR4 is configured to have the same size as the first output transistor QTR1 shown in FIG. 4.

When subjecting the reference cell 110 shown in FIG. 6 to the write operation during product inspection, the control circuit 800 sets the voltage VOTP at the write voltage VWR (7 V, for example) as described above. The control circuit 800 outputs the active (high level) write signal WRROM as shown in FIG. 5 to a gate of a write transistor RWTR. This causes the write transistor RWTR to be turned ON as shown in FIG. 5. The voltage VSS is 0 V, for example. Specifically, the voltage VWR is applied to the source of the floating-gate transistor RPROM, and the voltage VSS is applied to the drain of the floating-gate transistor RPROM. When such a high voltage (write voltage VWR) is applied to the floating-gate transistor RPROM, the PN junction in the floating-gate transistor RPROM breaks down, whereby electrons are released. Since the released electrons are trapped in the gate electrode of the floating-gate transistor RPROM, a channel is formed in the channel region of the floating-gate transistor RPROM. Specifically, when the floating-gate transistor RPROM has been subjected to the write operation, electricity is conducted between the source and the drain of the floating-gate transistor RPROM.

In the write operation, the signal level of the protection signal XPROT is set at the high level (inactive) as shown in FIG. 5, whereby a protection transistor RPTR is turned OFF. As shown in FIG. 5, the signal level of the read signal XREAD input to a gate of a read transistor RRTR is set at the high level (inactive). This causes the read transistor RRTR to be turned OFF and transistors TR4 and TR5 to be turned ON. Since the voltage VSS is applied to a source of the transistor TR4, the voltage of the signal from the output REF of the reference cell 110 shown in FIG. 6 is set at the voltage VSS. Specifically, in the write operation, the voltage of the signal from the output REF of the reference cell 110 is set at the voltage VSS. Since the voltage VSS is applied to gate electrodes of the third and fourth output transistors QTR3 and QTR4 by causing the transistor TR5 to be turned ON as shown in FIG. 5, the third and fourth output transistors QTR3 and QTR4 are reliably turned OFF.

When subjecting the OTP cell 130 shown in FIG. 4 to the read operation, the read operation is also performed for the reference cell shown in FIG. 6.

When subjecting the reference cell 110 shown in FIG. 6 to the read operation, the control circuit 800 outputs the active (low level) read signal XREAD as shown in FIG. 5 to the gate of the read transistor RRTR and outputs the inactive (low level) write signal WRROM to the gate of the write transistor RWTR. This causes the read transistor RRTR to be turned ON and the transistors TR4 and TR5 and the write transistor RWTR to be turned OFF. The control circuit 800 outputs the inactive (high level) protection signal XPROT to the gate of the protection transistor RPTR. This causes the protection transistor RPTR to be turned OFF.

When subjecting the OTP cell 130 to the read operation, the control circuit 800 sets the voltage VOTP at the write voltage VRD (3 V, for example) and sets the protection signal XPROT to be an inactive (high level) signal as described above. Since the floating-gate transistor RPROM shown in FIG. 6 has been subjected to the write operation, electricity is conducted between the source and the drain of the floating-gate transistor RPROM. Therefore, current flows through third and fourth nodes ND3 and ND4 shown in FIG. 6. Specifically, the third and fourth output transistors QTR3 and QTR4 are turned ON, whereby current flows between the source and the drain of the third output transistor QTR3. Since the third output transistor QTR3 is configured to have a size ⅛ of the size of the fourth output transistor QTR4, the current supply capability of the third output transistor QTR3 is ⅛ of the current supply capability of the fourth output transistor QTR4. This allows the signal from the output REF of the reference cell 110 to be set at a voltage level higher than the voltage level when the transistor QTR3 has the same size as the transistor QTR4.

In this embodiment, since the reference cell 110 includes the floating-gate transistor RPROM which has the same size and the same structure as the floating-gate transistor PROM of the OTP circuit 100, the reference cell 110 exhibits characteristic deterioration similar to that of the OTP circuit 100. This enables the OTP circuit 100 to store the display characteristic parameter with high accuracy. As a modification of this embodiment, a configuration in which the protection transistor RPTR is not provided in the reference cell 110 is also possible.

3. Refresh Operation

Figure 7:
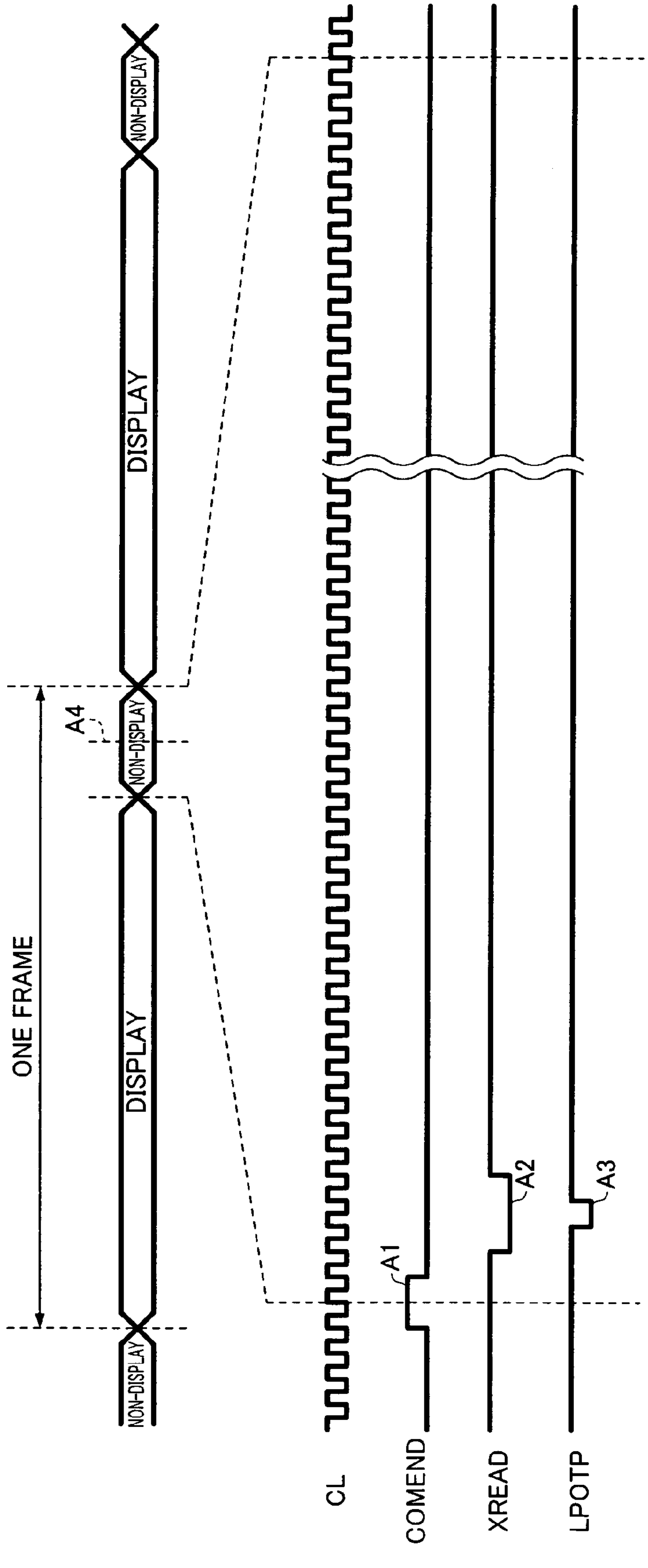
FIG. 7 shows a timing of refresh operation in which a contrast adjustment parameter is rewritten into a control register.

FIG. 7 is a diagram showing timing of a refresh operation which includes rewriting the contrast adjustment parameter (display characteristic parameter in a broad sense) into the control register. A reference clock signal CL is a synchronization signal generated by an internal oscillator or the like. In this embodiment, a non-display period is provided in units of one frame. However, the non-display period may be provided in units of two frames or m (m is a natural number of three or more) frames. When the display period has been completed, the RAM control circuit 300 shown in FIG. 1 generates a display period end pulse COMEND as indicated by A1, and outputs the display period end pulse COMEND to the control circuit 800. Upon receiving the display period end pulse COMEND, the control circuit 800 sets the read signal XREAD output to the OTP circuit 100 at the low level as indicated by A2 in synchronization with the reference clock signal CL, and then sets a control register latch signal LPOTP output to the control register 400 at the low level as indicated by A3. The control register 400 stores the contrast adjustment parameter from the OTP circuit 100 in response to the control register latch signal LPOTP.

The fall timing of the read signal XREAD indicated by A2 shown in FIG. 7 is delayed from the fall timing of the display period end pulse COMEND indicated by A1 for only one cycle of the reference clock signal CL. Specifically, in this embodiment, the start timing of the refresh operation is set in the first half period of the non-display period which is an early period after the display period. The first half period of the non-display period is a period before the middle of the non-display period indicated by A4 shown in FIG. 7.

Figure 8:
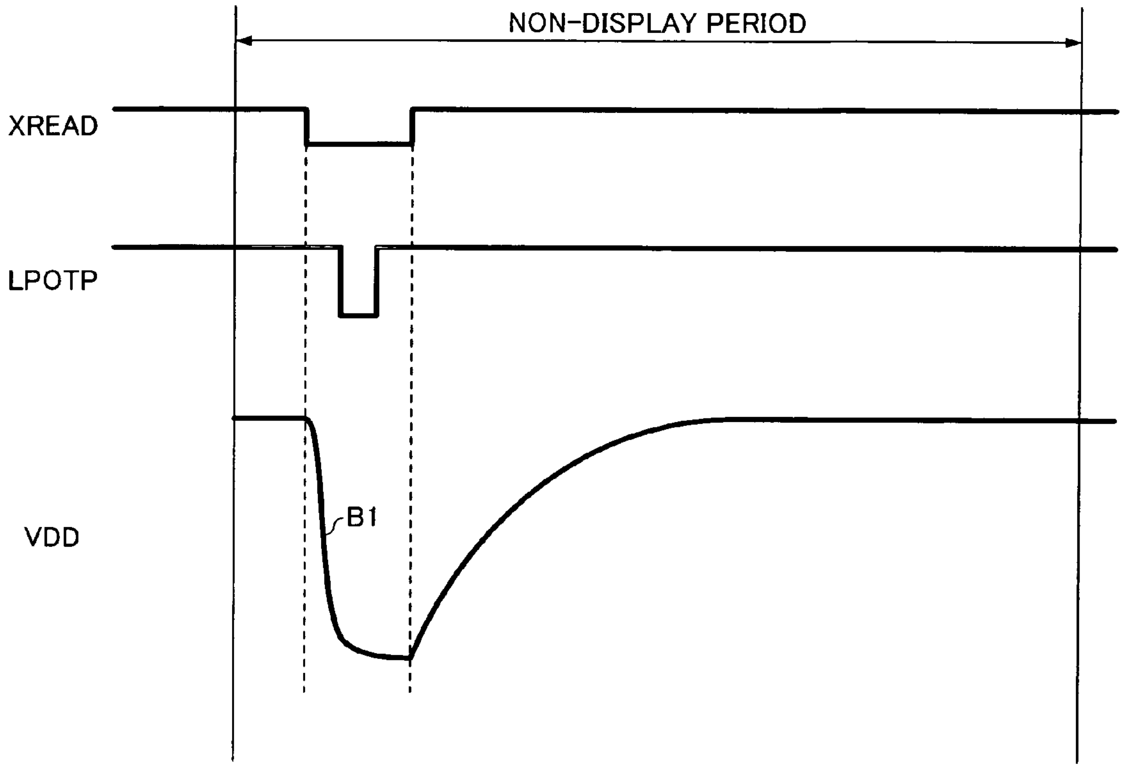
FIG. 8 shows the relationship between the timing of refresh operation and a power supply voltage.

FIG. 8 is a diagram showing the relationship between the timing of the refresh operation and the power supply voltage. When the OTP circuit 100 is subjected to the read operation, the power supply voltage inside the display driver is temporarily decreased as indicated by B1 shown in FIG. 8. The power supply voltage then reverts to a voltage VDD.

Figure 9:
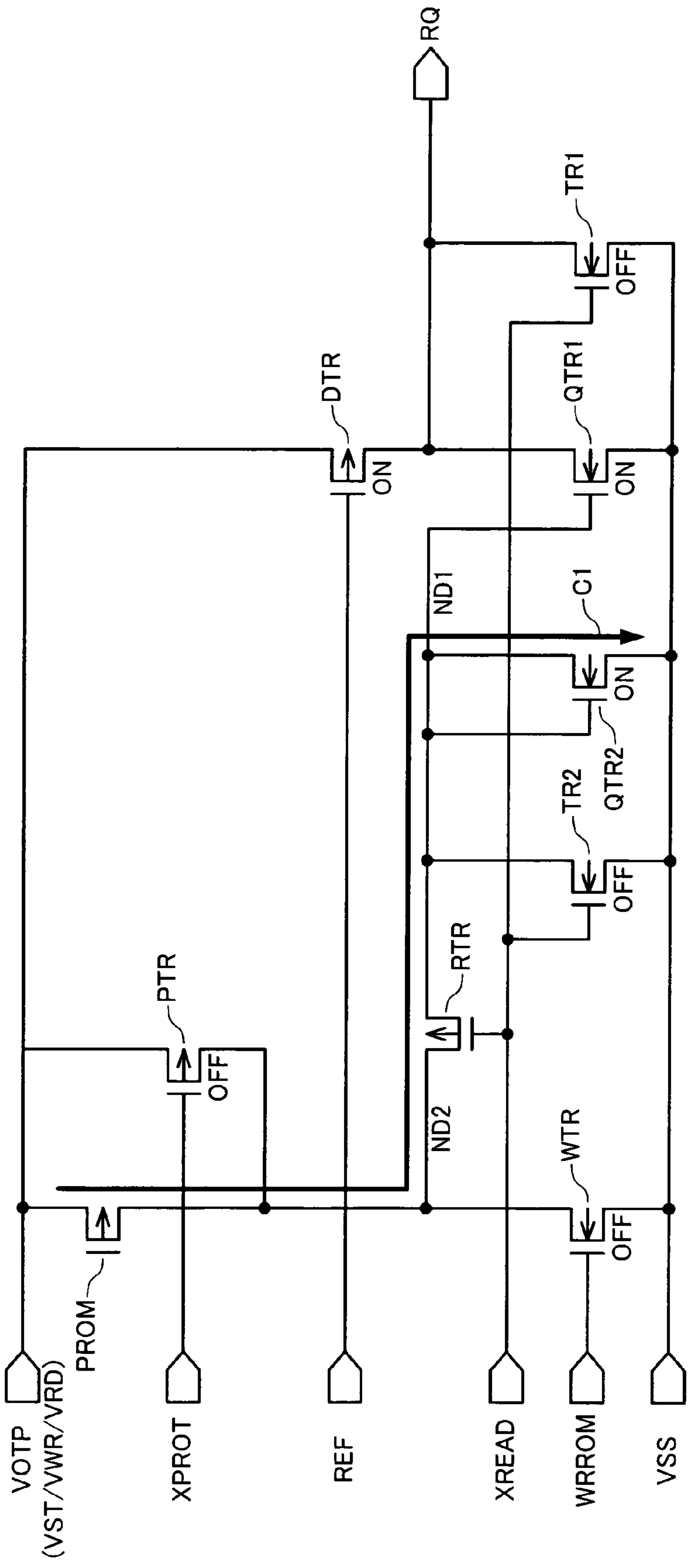
FIG. 9 shows a path of a shoot-through current which flows through an OTP cell in a read operation after a write operation.

FIG. 9 is a diagram showing a state of the OTP cell 130 in a read operation after the write operation for the OTP cell 130. When performing the read operation for the OTP cell 130 subjected to the write operation, the read transistor RTR is turned ON. Since electricity is conducted between the source and the drain of the floating-gate transistor PROM, the second output transistor QTR2 is turned ON. Specifically, a shoot-through current flows along a path indicated by C1 shown in FIG. 9. This causes the power supply voltage inside the display driver 30 shown in FIG. 1 to drop during the refresh operation. A decrease in the power supply voltage may adversely affect the display state of the display panel. In this embodiment, since the refresh operation is performed in the first half period of the non-display period as shown in FIG. 7, the power supply voltage has reverted to the voltage VDD when the display period starts. Therefore, the refresh operation of the display characteristic parameter can be performed without adversely affecting the display state.

Figure 10:
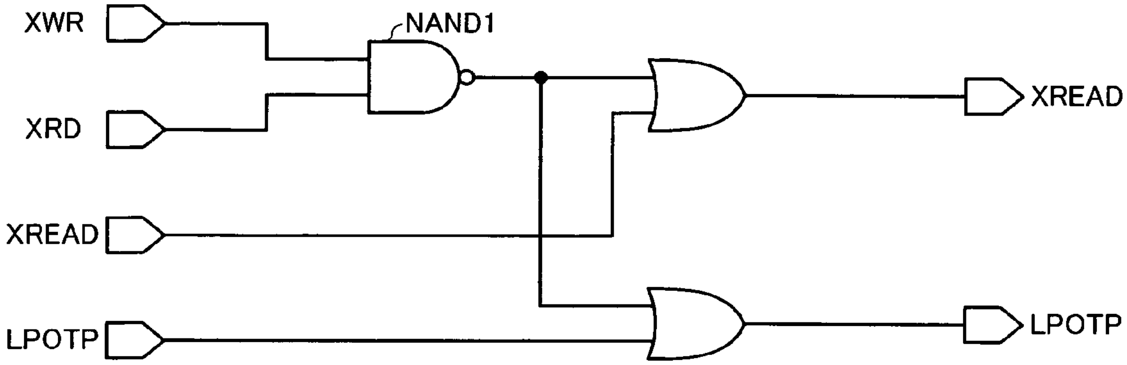
FIG. 10 is a diagram showing a logic circuit which disables refresh operation during MPU access.

FIG. 10 is a diagram showing a logic circuit 810 which disables the refresh operation during MPU access. The logic circuit 810 is included in the control circuit 800. A write signal XWR and a read signal XRD from the MPU (processor unit which controls the display driver in a broad sense) are input to the logic circuit 810. The read signal XREAD and the control register latch signal LPOTP output from the control circuit 800 are input to the logic circuit 810.

An output XREAD' from the logic circuit 810 is input to the OTP circuit 100 as the read signal XREAD from the control circuit 800. An output LPOTP' from the logic circuit 810 is input to the control register 400 as the control register latch signal LPOTP from the control circuit 800.

The control circuit 800 outputs the read signal XREAD and the control register latch signal LPOTP which are active (low level) in response to the display period end pulse COMEND as described above. However, when the control circuit 800 is accessed from the MPU, the write signal XWR or the read signal XRD becomes active (low level), whereby the output from a circuit NAND1 is set at the high level. In this case, the outputs XREAD' and LPOTP' are always set at the high level irrespective of the read signal XREAD and the control register latch signal LPOTP. Specifically, the refresh operation is not performed during the MPU access.

Figure 11:
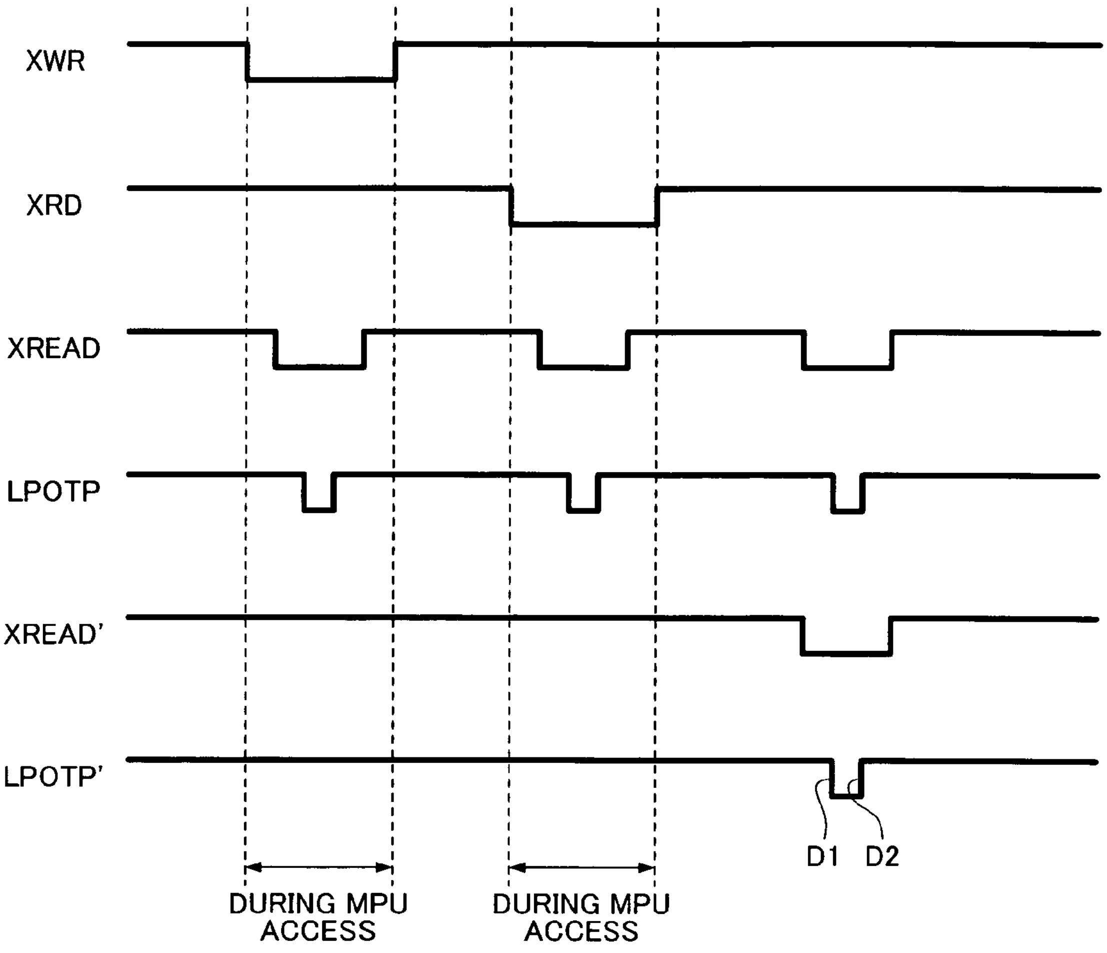
FIG. 11 is a timing waveform chart showing the relationship among the input and output signals of the logic circuit shown in FIG. 10.

FIG. 11 is a timing waveform chart showing the relationship among the input signals and the output signals of the logic circuit 810 shown in FIG. 10. As shown in FIG. 11, the outputs XREAD' and LPOTP' are always set at the high level during the MPU access even if the read signal XREAD and the control register latch signal LPOTP are active (low level). Since power consumption is increased during the MPU access, malfunctions likely occur if the refresh operation is concurrently performed. Moreover, the MPU access timing is asynchronous. However, the refresh operation can be disabled during the asynchronous MPU access by using the logic circuit 810 in this embodiment.

As a modification, the logic circuit 810 may be provided outside the control circuit 800, or the control circuit 800 may not include the logic circuit 810.

Figure 12:
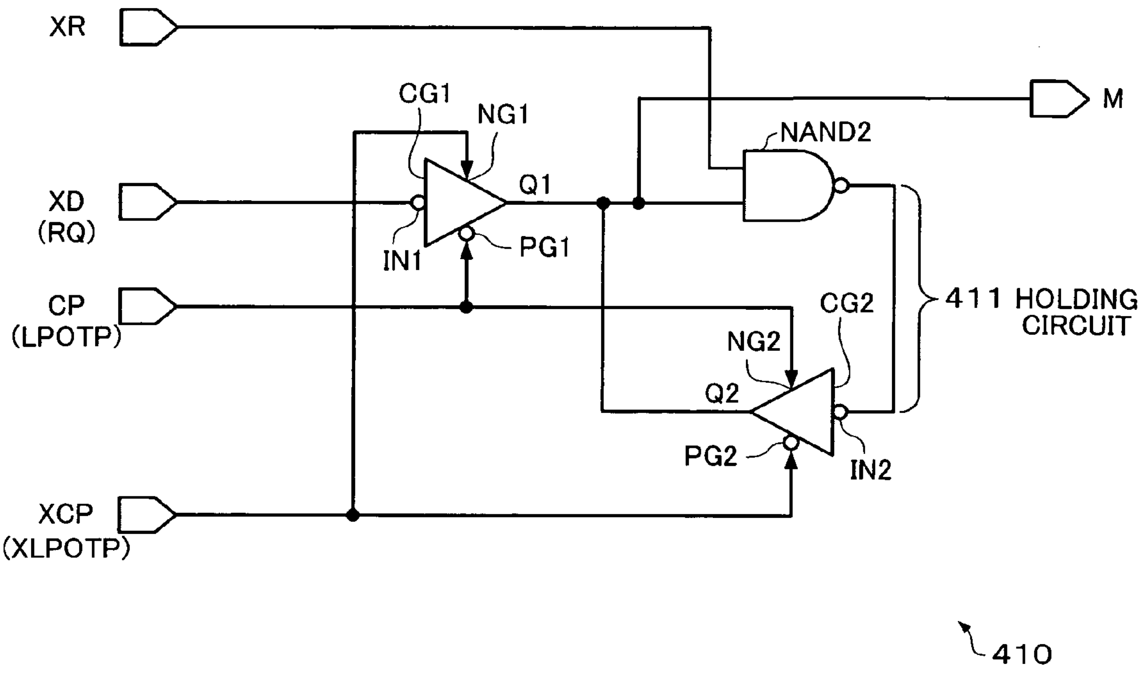
FIG. 12 is a circuit diagram showing a latch circuit in a control register.

FIG. 12 is a circuit diagram of a latch circuit 410 included in the control register 400. A plurality of latch circuits 410 are included in the control register 400. In this embodiment, 12 latch circuits 410 are included in the control register 400, for example. A data input terminal XD of the latch circuit 410 is connected with the output RQ of each of the mask-bit ROMs 121 and 122 and the OTP cells OTP11 to OTP15 and OTP21 to OTP25 shown in FIG. 2. A reset input terminal XR is a terminal to which a low-level signal is input when it is desired to set a signal from an output M of the latch circuit 410 at the low level. For example, when the floating-gate transistor RPROM of the reference cell 110 is not subjected to the write operation, such during inspection, a low-level signal is input to the reset input terminal XR in order to set the signal from the output M at the low level. In the normal operation, a high-level signal is always input to the reset input terminal XR.

The control register latch signal LPOTP (LPOTP') is input to a clock input terminal CP from the control circuit 800. An inversion latch signal XLPOTP, which is an inversion signal of the control register latch signal LPOTP (LPOTP'), is input to a clock input terminal XCP. Each of inverters CG1 and CG2 includes a clocked CMOS gate. For example, the inverter function of the inverter CG1 is activated when a low-level signal is input to a terminal PG1 of the inverter CG1 and a high-level signal is input to a terminal NG1 of the inverter CG1 at the same time. Specifically, the inverter CG1 outputs an inversion signal of a signal input to an input IN1 of the inverter CG1 from an output Q1. When a high-level signal and a low-level signal are respectively input to the terminals PG1 and NG1 of the inverter CG1 at the same time, the output Q1 of the inverter CG1 is set in a high impedance state. The inverter CG2 operates in the same manner as the inverter CG1.

Suppose that the signal from the output RQ of the mask-bit ROM 121 or 122 or the OTP cell 130 is set at the high level, specifically, a high-level signal is input to the data input terminal XD. When performing the refresh operation, the control register latch signal LPOTP (LPOTP') input to the terminal CP is set at the low level as indicated by D1 shown in FIG. 11. As a result, the inversion latch signal XLPOTP input to the terminal XCP is set at the high level. This causes a low-level signal to be input to the terminal PG1 of the inverter CG1 and a high-level signal to be input to the terminal NG1, whereby the inverter function of the inverter CG1 is activated. Specifically, since a high-level signal is input to the input IN1 of the inverter CG1, a low-level signal is output from the output Q1 of the inverter CG1. Since the output Q2 of the inverter CG2 is in a high impedance state, the signal from the output M of the latch circuit 410 is set at the low level. Since the high-level signal input to the terminal XR and the low-level signal from the output Q are input to a circuit NAND2, the circuit NAND2 outputs a high-level signal to an input IN2 of the inverter CG2.

As indicated by D2 shown in FIG. 11, since the control register latch signal LPOTP (LPOTP') input to the terminal CP is set at the high level, the inversion latch signal XLPOTP input to the terminal XCP is set at the low level. This causes a high-level signal to be input to the terminal NG2 of the inverter CG2 and a low-level signal to be input to the terminal PG2 of the inverter CG2, whereby the inverter function of the inverter CG2 is activated. Specifically, since the high-level signal is input to the input IN2 of the inverter CG2 from the circuit NAND2, a low-level signal is output from the output Q2 of the inverter CG2. Since the output Q1 of the inverter CG1 is in a high impedance state, the signal from the output M of the latch circuit 410 is set at the low level.

Specifically, the signal from the output M of the latch circuit 410 is always set at the low level when a high-level signal is input to the data input terminal XD of the latch circuit 410. When a low-level signal is input to the data input terminal XD, the signal from the output M of the latch circuit 410 is always set at the high level for the same reason as described above.

Since the output from the circuit NAND2 is maintained in a period in which the control register latch signal LPOTP (LPOTP') is set at the high level, specifically in a period in which the inverter CG2 is active, the section formed by the circuit NAND2 and the inverter CG2 may be considered as a holding circuit 411. Specifically, the latch circuit 410 includes the function of the inverter and the function of the holding circuit 411.

For example, when the floating-gate transistor PROM included in the mask-bit ROM 121 shown in FIG. 2 has been subjected to the write operation, the signal from the output RQ of the mask-bit ROM 121 is set at the low level. However, since the signal from the output RQ is input to the latch circuit 410, a high-level signal is output from the output M of the latch circuit 410 through the inverter CG1 of the latch circuit 410. Specifically, since the output from the control register 400 is set at the high level when the mask-bit ROM121 shown in FIG. 2 has been subjected to the write operation, writing during initialization and the output from the control register 400 are consistent. This enables the user of the display driver 30 according to this embodiment to easily achieve initialization (setting of the contrast adjustment parameter or the like).

As a modification of the latch circuit 410, the inverter CG1 may be replaced with a CMOS inverter and the holding circuit 411 may be replaced with a flip-flop circuit or the like. However, since the clocked CMOS gate is used in this embodiment, the circuit scale of the latch circuit 410 can be reduced.

Figure 13:
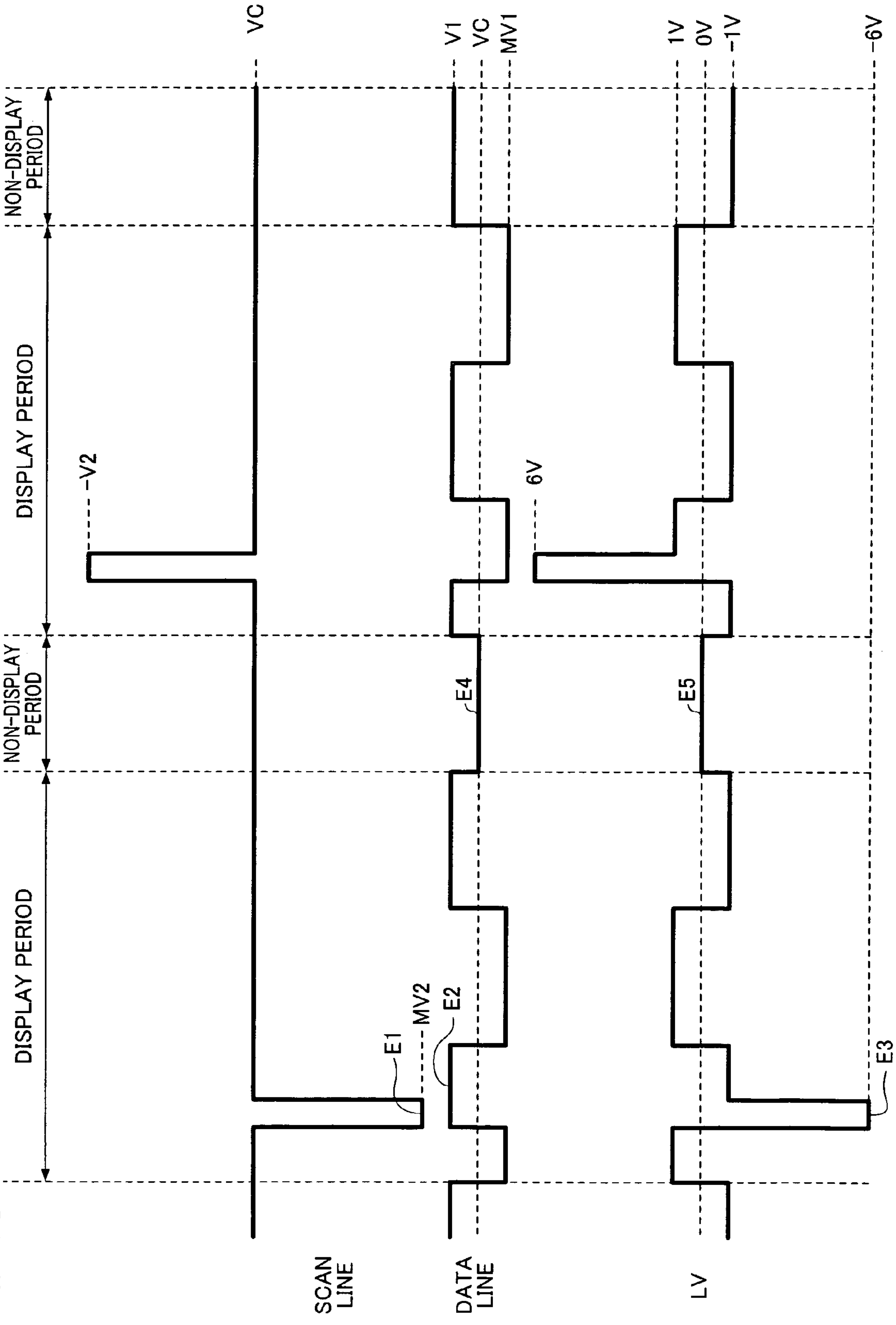
FIG. 13 is a timing waveform chart showing a voltage applied to a pixel of a display panel.

FIG. 13 is a timing waveform chart showing voltage applied to a pixel of the display panel. For example, when a voltage MV2 is applied to a scan line as indicated by E1 and a voltage V1 is applied to a data line as indicated by E2 in the non-display period, a voltage (MV2-V1 such as −6 V) is applied to the corresponding pixel as indicated by E3. In the non-display period, the scan driver 600 shown in FIG. 1 supplies a voltage VC to the scan line. In the non-display period, the data driver 700 shown in FIG. 1 supplies the voltage VC to the data line as indicated by E4. Specifically, the voltage applied to the pixel is set at 0 V in the non-display period as indicated by E5. Specifically, the voltage applied to the pixel is set at 0 V in the non-display period by setting the voltage supplied to the scan line from the scan driver 600 and the voltage supplied to the data line from the data driver 700 to be the same. Since the voltage applied to the pixel is set at 0 V, the display state of the display panel is not affected even if a voltage drop occurs due to the refresh operation. Therefore, this embodiment enables the refresh operation which reduces adverse effects on the display state.

4. Effects

In this embodiment, the floating-gate transistor PROM (one-time-PROM (OTP) in a narrow sense) is used in the OTP circuit 100 (nonvolatile storage circuit in a broad sense). Since the floating-gate transistor PROM is a transistor in which a gate of a conventional transistor is set in a floating state, the floating-gate transistor PROM can be easily formed in the display driver using a conventional process. Specifically, the manufacturing cost can be reduced. The floating-gate transistor PROM used in this embodiment may be an erasable PROM.

In this embodiment, the timing of the refresh operation is set in the first half period of the non-display period. This prevents the display state of the display panel from being affected even if the power supply voltage drops due to the refresh operation, whereby the display panel can be driven with an increased image quality by preventing screen flickering or the like. The effect of external static electricity or the like is increased accompanying an increase in the resolution of the display panel in the future, whereby the number of refresh operations is increased. Specifically, since this embodiment can reduce the effect on the display state during the refresh operation, this embodiment can also exert a significant effect on a high-resolution display panel.

Moreover, since the amount of data is increased as the resolution of the display panel is increased, the number of MPU accesses is increased. However, this embodiment is configured so that the refresh operation is not performed in a period in which the MPU (processor unit which controls the display driver in a broad sense) accesses the control circuit 800. The MPU access consumes a large amount of electric power. However, since the refresh operation is disabled during the MPU access, malfunctions caused by a decrease in the power supply voltage or the like can be prevented. For example, the logic circuit 810 shown in FIG. 10 can disable the refresh operation during the MPU access.

If the resolution of the display panel is increased, a large amount of screen blurring or the like may occur when the refresh operation is performed in the non-display period. In this embodiment, the voltage supplied to the scan line and the voltage supplied to the data line can be set at the same voltage in the non-display period. Specifically, the voltage applied to each pixel of the display panel can be set at 0 V in the non-display period. As a result, this embodiment prevents screen blurring or the like, whereby a high-resolution display panel can be driven with an increased display quality.

This embodiment can exert the above-described effects on a low-resolution display panel. This embodiment can drive various display panels 20 (TFT liquid crystal, TFD liquid crystal, simple matrix liquid crystal, organic EL panel, inorganic EL panel, and the like). Moreover, this embodiment can deal with various drive methods (MLS drive, PWM method, and the like).

Although only some embodiments of the present invention have been described in detail above, those skilled in the art will readily appreciate that many modifications are possible in the embodiments without departing from the novel teachings and advantages of this invention. Accordingly, all such modifications are intended to be included within the scope of this invention.

For example, any term cited with a different term having broader or the same meaning at least once in this specification and drawings can be replaced by the different term in any place in this specification and drawings.

What is claimed is:

1. A display driver, comprising:

a scan driver and a data driver which drive a display panel;

a one-time PROM (OTP) circuit which includes a plurality of OTP cells;

a control circuit; and a control register, a display characteristic parameter corresponding to display characteristics of the display panel being written into the OTP circuit during initialization, the control register stores the display characteristic parameter supplied from the OTP circuit, each of the plurality of OTP cells including a floating-gate transistor which has a floating gate, the control circuit outputting a read signal to the OTP circuit when the control circuit reads the display characteristic parameter from the OTP circuit, the control circuit outputting a write signal to the OTP circuit when writing the display characteristic parameter into the OTP circuit, the control circuit performing refresh operation at a predetermined timing set in a first half of a non-display period of the display panel, the refresh operation including reading the display characteristic parameter from the OTP circuit and rewriting the display characteristic parameter into the control register, each of the plurality of OTP cells including a decision transistor provided between a node of a first power supply and a node of a second power supply, a reference voltage being input to a gate of the decision transistor, the OTP circuit including a reference cell that includes the floating-gate transistor, and the reference cell generating the reference voltage.

2. The display driver as defined in claim 1, each of the plurality of OTP cells including:

a first output transistor provided in series with the decision transistor between the node of the first power supply and the node of the second power supply; and a second output transistor provided between the node of the second power supply and a first node that is connected to a gate of the first output transistor, a drain and a gate of the second output transistor are connected to the first node.

3. The display driver as defined in claim 1, the control circuit controlling the scan driver and the data driver so that a voltage used by the scan driver for driving the display panel is equal to a voltage used by the data driver for driving the display panel, in the non-display period.

4. The display driver as defined in claim 1, the control circuit disabling the refresh operation of the OTP circuit in a period in which a processor unit which controls the display driver accesses the control circuit.

5. The display driver as defined in claim 1, further comprising a power supply circuit, the display characteristic parameter includes a contrast adjustment parameter, and the power supply circuit receiving from the control register the contrast adjustment parameter written into the control register from the OTP circuit, and outputting a predetermined voltage based on the contrast adjustment parameter.

6. An electronic instrument, comprising:

the display driver as defined in claim 1;

a display panel; and a processor unit which controls the display driver.

7. A display driver, comprising:

a scan driver and a data driver that drive a display panel;

a one-time PROM (OTP) circuit that includes a plurality of OTP cells;

a control circuit; and a control register, a display characteristic parameter corresponding to display characteristics of the display panel being written into the OTP circuit during initialization, the control register storing the display characteristic parameter supplied from the OTP circuit, each of the plurality of OTP cells including a floating-gate transistor that has a floating gate, the control circuit outputting a read signal to the OTP circuit when the control circuit reads the display characteristic parameter from the OTP circuit, the control circuit outputting a write signal to the OTP circuit when writing the display characteristic parameter into the OTP circuit, the control circuit performing a refresh operation at a predetermined timing set in a first half of a non-display period of the display panel, the refresh operation including reading the display characteristic parameter from the OTP circuit and rewriting the display characteristic parameter into the control register, each of the plurality of OTP cells including a decision transistor provided between a node of a first power supply and a node of a second power supply, a reference voltage being input to a gate of the decision transistor, each of the plurality of OTP cells including:

a first output transistor provided in series with the decision transistor between the node of the first power supply and the node of the second power supply; and a second output transistor provided between the node of the second power supply and a first node that is connected to a gate of the first output transistor, a drain and a gate of the second output transistor being connected to the first node, each of the plurality of OTP cells including a read transistor provided between the first node and a second node that is connected to a drain of the floating-gate transistor, and the read signal being input to a gate of the read transistor.

8. The display driver as defined in claim 7, each of the plurality of OTP cells includes a write transistor provided between the second node and the node of the second power supply, and the write signal is input to a gate of the write transistor.

9. The display driver as defined in claim 7, each of the plurality of OTP cells includes a protection transistor provided between the node of the first power supply and the second node and in parallel with the floating-gate transistor, and the control circuit outputs a protection signal which protects the floating-gate transistor against deterioration to a gate of the protection transistor when data reading from the OTP circuit or data writing into the OTP circuit is not performed.

10. The display driver as defined in claim 9, the control circuit disabling the refresh operation of the OTP circuit in a period in which a processor unit that controls the display driver accesses the control circuit.

11. The display driver as defined in claim 9, further comprising a power supply circuit, the display characteristic parameter including a contrast adjustment parameter, and the power supply circuit receiving from the control register the contrast adjustment parameter written into the control register from the OTP circuit, and outputting a predetermined voltage based on the contrast adjustment parameter.

12. A display driver, comprising:

a scan driver and a data driver that drive a display panel;

a one-time PROM (OTP) circuit that includes a plurality of OTP cells;

a control circuit; and a control register, a display characteristic parameter corresponding to display characteristics of the display panel being written into the OTP circuit during initialization, the control register storing the display characteristic parameter supplied from the OTP circuit, each of the plurality of OTP cells including a floating-gate transistor that has a floating gate, the control circuit outputting a read signal to the OTP circuit when the control circuit reads the display characteristic parameter from the OTP circuit, the control circuit outputting a write signal to the OTP circuit when writing the display characteristic parameter into the OTP circuit, the control circuit performing a refresh operation at a predetermined timing set in a first half of a non-display period of the display panel, the refresh operation including reading the display characteristic parameter from the OTP circuit and rewriting the display characteristic parameter into the control register, each of the plurality of OTP cells including a decision transistor provided between a node of a first power supply and a node of a second power supply, a reference voltage being input to a gate of the decision transistor, each of the plurality of OTP cells including:

a first output transistor provided in series with the decision transistor between the node of the first power supply and the node of the second power supply; and a second output transistor provided between the node of the second power supply and a first node that is connected to a gate of the first output transistor, a drain and a gate of the second output transistor being connected to the first node, the OTP circuit including a reference cell that includes the floating-gate transistor, and the reference cell generating the reference voltage.

13. The display driver as defined in claim 12, the reference cell includes a third output transistor provided between the node of the first power supply and the node of the second power supply, the floating-gate transistor is provided between the node of the first power supply and a node which is connected to a gate of the third output transistor, and current capability of the third output transistor is lower than current capability of the first output transistor.

* * * * *